United States Patent
Wu et al.

(10) Patent No.: US 7,131,079 B2
(45) Date of Patent: Oct. 31, 2006

(54) METHOD OF GENERATING PROTECTED STANDARD DELAY FORMAT FILE

(75) Inventors: Kun-Cheng Wu, Hsinchu (TW); Chien-Ming Huang, Hsinchu (TW); Chang-Chung Wu, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 221 days.

(21) Appl. No.: 10/839,534

(22) Filed: May 4, 2004

(65) Prior Publication Data
US 2005/0251764 A1    Nov. 10, 2005

(51) Int. Cl.
G06F 17/50    (2006.01)
(52) U.S. Cl. .................... 716/3; 716/4; 716/6
(58) Field of Classification Search ............ 716/6, 716/4, 3
See application file for complete search history.

(56) References Cited

U.S. PATENT DOCUMENTS 6,587,999 B1 *  7/2003  Chen et al. ............... 716/6
6,668,359 B1 * 12/2003  Fakhry et al. ............ 716/3
6,766,506 B1 *  7/2004  Ratzlaff et al. .......... 716/18

OTHER PUBLICATIONS

"Automatic Method for Verifying NDR and Simulation Models", Oct. 2001, IBM Technical Disclosure Bulletin, iss. 450, p. No. 1716 (8 pages).*
Franzon et al., "Tutorial 1—Introduction to ASIC Design Methodology", Spring 1999, rev. 99.1, pp. 1-32.*
"IEEE Standard for Standard Delay Format (SDF) for the Electronic Design Process", Dec. 2001, IEEE STD 1497-2001, 81 pages.*

* cited by examiner

Primary Examiner—Sun James Lin
(74) Attorney, Agent, or Firm—Winston Hsu

(57) ABSTRACT

A method of generating a protected standard delay format (SDF) file is disclosed. The interconnect delay descriptions of a SDF file are backwardly or forwardly integrated into the related cell delay descriptions according to their interconnection type to generate the protected SDF file. The total delay value of each signal path is the same as original, so that the simulation result generated by a simulator is not affected.

6 Claims, 3 Drawing Sheets

METHOD OF GENERATING PROTECTED STANDARD DELAY FORMAT FILE

BACKGROUND OF THE INVENTION

1. Field of the Invention

This invention generally relates to a standard delay format (SDF) file, and more particularly, to a method of generating a protected SDF file.

2. Description of Related Art

As the semiconductor manufacturing technology advances, the integrated circuit (IC) becomes the most important electronic devices for all equipment. To simplify the IC design process, a variety of computer aided design (CAD) tools have been developed to aid the designer to design the IC.

FIG. 1 is a typical IC design flow chart. Referring to FIG. 1, the IC designer will use the high-level language such as Vernlog or VHDL to describe the function of the IC and create the RTL file 110. The RTL file 110 is then inputted to the synthesizer 120 and is converted into the netlist 140 in the cell level based on the library 130 provided by the semiconductor foundry. The netlist 140 includes the cells for providing the function of the IC and describes the interconnection between those cells for the layout.

To simulate and verify the function of the IC before the IC are manufactured, the IC designers will use the delay calculator 150 based on the netlist 140 and the timing library 160 to generate the SDF file 150 for the simulator 190 to verify. The SDF file 170 generally includes the cell delay description and the interconnect delay description. The cell delay description describes the signal transmission delay data on the cell I/O path. The interconnect delay description describes the signal transmission delay data of the interconnection between the cells. These signal transmission delay data are estimated values before the layout is complete. After the layout is complete, the precise signal transmission delay data can be calculated by referring the extracted RC data 145 from the RC extractor. The extracted RC data 145 is the physical resistor and capacitor data extracted by the RC extractor. Then the simulator 190 outputs the simulation result based on the netlist 140, the SDF file 170 and the simulation model 180.

As shown above, the netlist and the SDF file include the data regarding the cells and the interconnection between the cells. If those files are not protected, an unauthorized person can obtain the complete IC design by reverse-engineering. Generally, the netlist can be generated as the binary format for protection. However, the SDF file is represented by ASCII format and cannot be effectively protected.

SUMMARY OF THE INVENTION

The present invention is directed to a method of generating a protected SDF file without affecting the simulation result by the simulator.

The present invention is directed to a method of generating a protected standard delay format file, suitable for converting a standard delay format file (e.g., IEEE 1497 SDF file) to a protected standard delay format file. According to an embodiment of the present invention, first, a delay description of the standard delay format file is read. Next, whether or not the delay description is an interconnect delay description is determined, and if the delay description is an interconnect delay description, a delay data of the delay description is integrated into a cell delay description of a cell connected to an interconnect corresponding to the delay description bases on the type of the interconnect.

In an embodiment of the present invention, when the interconnect is an one-to-one interconnect, the delay data of the delay description is integrated into a cell delay description of a driving cell or a driven cell connected to the one-to-one interconnect.

In an embodiment of the present invention, when the interconnect is an multi-to-one interconnect, the delay data of the delay description is integrated into a cell delay description for a driving cell connected to the interconnect.

In an embodiment of the present invention, when the interconnect is an one-to-multi interconnect, the delay data of the delay description is integrated into a cell delay description for a driven cell connected to the interconnect. After integrating the delay data of the delay description into the cell delay description for the driven cell connected to the interconnect, a timing check value of the driven cell is adjusted according to the delay data of the delay description.

In the light of the above, a portion of the interconnect delay description in the SDF file is integrated into the related cell delay description so that the SDF file generated, according to an embodiment of the present invention, can be effectively protected. In addition, regarding the signal path, the delay is still the same. Hence, applying the method of generating a protected file, according to an embodiment of the present invention, will not affect the simulation result.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

Figure 1:
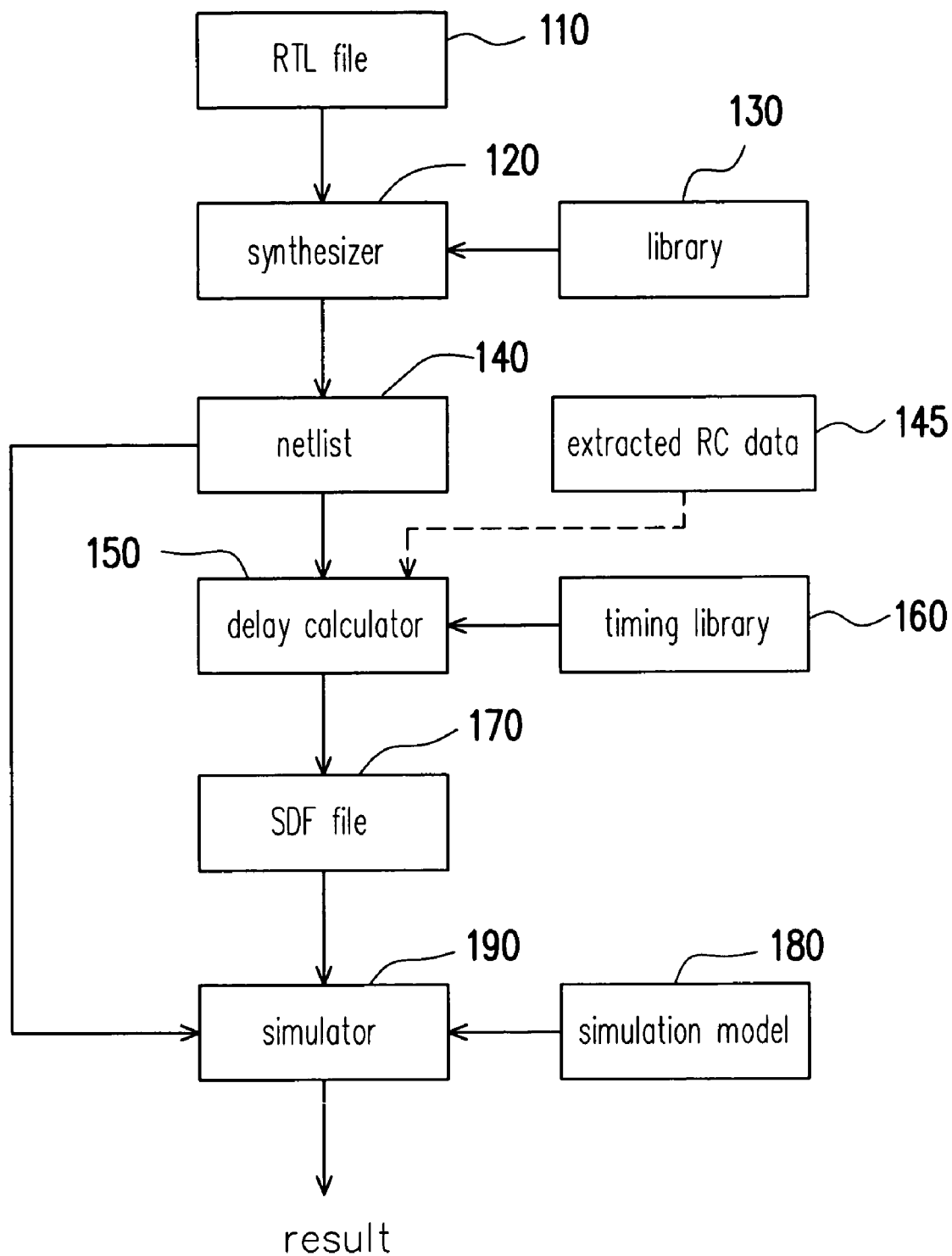
FIG. 1 is a typical IC design flow chart.
Figure 2:
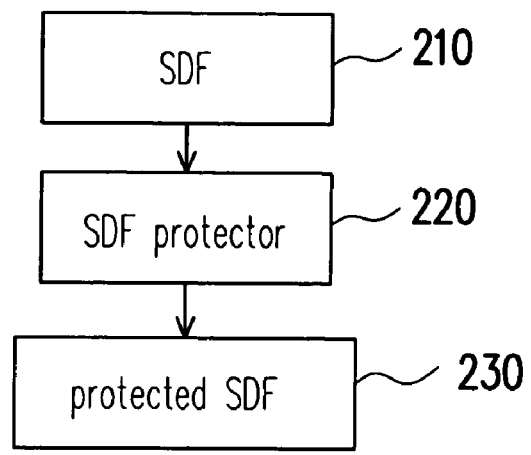
FIG. 2 is a flowchart illustrating a method of generating a protected SDF file in accordance with an embodiment of the present invention.

FIG. 2 is a flowchart illustrating a method of generating a protected SDF file in accordance with an embodiment of the present invention. The SDF file, such as IEEE 1497 SDF file 210, is inputted into the SDF protector 220. The SDF protector 220 converts the SDF file 210 to the protected SDF file 230 to prevent an unauthorized person getting access to IC design by reverse-engineering.

Figure 3:
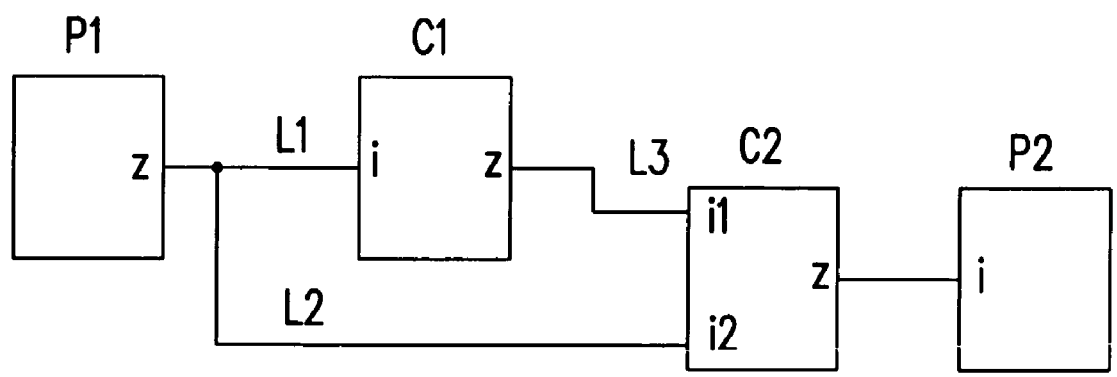
FIG. 3 shows interconnects between a portion of cells in an IC design.

FIG. 3 shows interconnects between a portion of cells in an IC design. The SDF file of the IC design in FIG. 3 includes the delay description as follows:

```
(CELL
    (CELLTYPE "SYSTEM")
    (INSTANCE )
    (DELAY
        (ABSOLUTE
            (INTERCONNECT P1/z C1/i (.145::.145) (.125::.125))
            (INTERCONNECT P1/z C2/i2 (.135::.135) (.130::.130))
            (INTERCONNECT C1/z C2/i1 (.095::.095) (.095::.095))
```

```
            (INTERCONNECT C2/z P2/i (.055::.055) (.075::.075))
        )
    )
)
(CELL
    (CELLTYPE "INV")
    (INSTANCE C1)
    (DELAY
        (ABSOLUTE
            (IOPATH i z (.345::.345) (.325::.325))
        )
    )
)
(CELL
    (CELLTYPE "OR2")
    (INSTANCE C2)
    (DELAY
        (ABSOLUTE
            (IOPATH i1 z (.300::.300) (.325::.325))
            (IOPATH i2 z (.300::.300) (.325::.325))
        )
    )
)
```

Wherein the delay description including "INTERCONNECT" represents the interconnect delay description. The delay description including "IOPATH" represents the cell delay description of the delay data of different cell I/O paths.

In FIG. 3, the interconnect L3 between the terminal z of the cell C1 and the terminal i1 of the cell C2 is a one-to-one interconnect. The cell C1 with respect to L3 is a driving cell for outputting signal. The cell C2 is a driven cell for receiving the signal. To the one-to-one interconnect, one can choose to integrate the interconnect delay data into the cell delay description of the driving cell C1 or the driven cell C2 connected to the one-to-one interconnect. However, if one chooses to integrate the interconnect delay data into the driven cell C2 and if the cell C2 is a sequential logic gate, it will affect the timing check value such as the setup time, the holding time, the recovery time, and the removal time of the cell C2. Hence, it requires adjustment of the timing check value of the cell C2 based on the delay data of the interconnect delay description. Therefore, it would be a better choice to integrate the interconnect delay data into the driving cell C1.

In addition, the interconnects L1 and L2 from the terminal z of the cell P1 to the terminal of the cell C1 and the terminal i2 of the cell C2 is a one-to-multi interconnect. To the one-to-multi interconnect, when one chooses to integrate the interconnect delay data into the cell delay description of the cell in the previous stage, if the delays between the interconnects L1 and L2 are different, the issue of impreciseness will result. Hence, it would be better to integrate the interconnect delay data into the cell delay description of the cell in the subsequent stage and thus to integrate the interconnect delay data into the cell delay description (IOPATH i z) of the cell C1 and into the cell delay description (IOPATH i2 z) of the cell C2 respectively. Further, it requires adjustment of the timing check value (such as the setup time, the holding time, the recovery time, and the removal time) of the cells C1 and C2. The interconnect delay time should be added to the setup time and the recovery time to prevent the timing check result from being affected. The interconnect delay time should be subtracted from the holding time and the removal time to prevent the timing check result from being affected.

In addition to the above two interconnects, the possible interconnect can be the multi-to-one interconnect and the multi-to-multi interconnect. To the multi-to-one interconnect, there would be no impreciseness issue when choosing to integrate the interconnect delay data into the cell delay description of the cell in the previous stage. Therefore, it is acceptable to integrate the interconnect delay data into the cell delay description of the cell in the previous stage. To the multi-to-multi interconnect, there would always be an impreciseness issue regardless of whether to integrate the interconnect delay data into the cell delay description of the cell in the previous stage or in the subsequent stage. Hence, one can choose the interconnect with a shortest delay, integrate the shortest delay into the cell delay description of the cell in the previous stage or in the subsequent stage, and subtract the shortest delay from the delay of the other interconnects, in order to reduce one interconnect delay description.

According to the principle described above, the delay of the interconnects L1 (between the terminal z of cell P1 and the terminal i of cell C1) and L2 (between the terminal z of cell P1 and the terminal i2 of cell C2) can be integrated into the cell delay description (IOPATH i z) of the cell C1 and the cell delay description (IOPATH i2 z) of the cell C2. The delay of the interconnects L3 (between the terminal z of cell C1 and the terminal i1 of cell C2) can be integrated into the cell delay description (IOPATH i z) of the cell C1. Hence, the integrated delay description based on the above example is as follows:

```
(CELL
    (CELLTYPE "SYSTEM")
    (INSTANCE )
    (DELAY
        (ABSOLUTE
            (INTERCONNECT C2/z P2/i (.055::.055) (.075::.075))
        )
    )
)
(CELL
    (CELLTYPE "INV")
    (INSTANCE C1)
    (DELAY
        (ABSOLUTE
            (IOPATH i z (.585::.585) (.545::.545))
        )
    )
)
(CELL
    (CELLTYPE "OR2")
    (INSTANCE C2)
    (DELAY
        (ABSOLUTE
            (IOPATH i1 z (.300::.300) (.325::.325))
            (IOPATH i2 z (.435::.435) (.455::.455))
        )
    )
)
```

Because the above SDF file lack a portion of interconnect data, it is difficult to obtain the IC design by reverse-engineering. Hence, the IC design can be protected.

Figure 4:
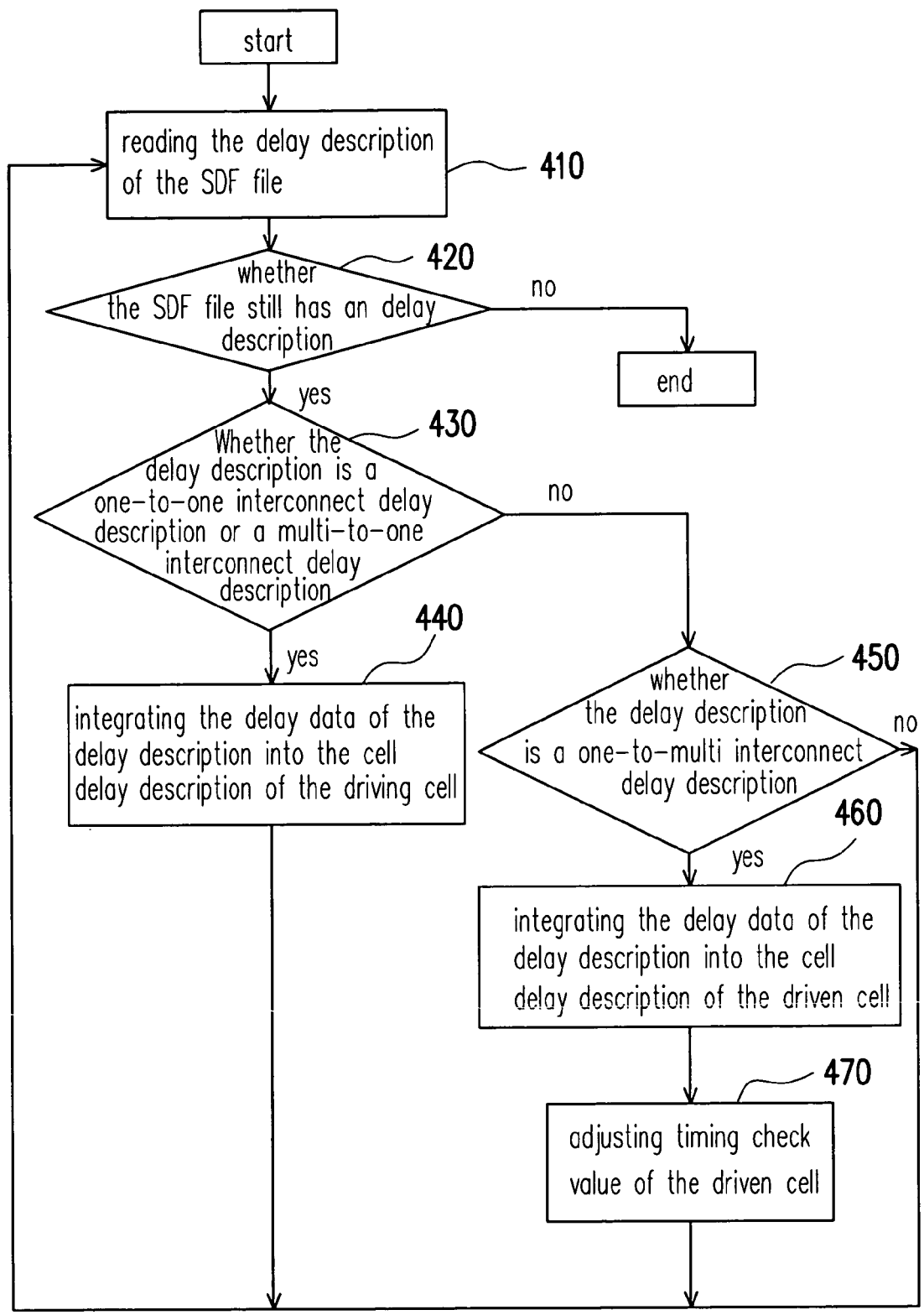
FIG. 4 is a flowchart illustrating a method of generating a protected SDF file in accordance with an embodiment of the present invention.

FIG. 4 is a flow chart illustrating a method of generating a protected SDF file in accordance with an embodiment of the present invention. In step S410, the delay description of the SDF file is read. In step S420, whether the SDF file still contains any delay description is determined. If it is determined that the SDF does not contain any delay description, it means that the protected SDF file has been generated. Otherwise, the method proceeds to step S430, in which whether the delay description is a one-to-one interconnect delay description or a multi-to-one interconnect delay description is determined.

If the interconnect delay description is determine to be a one-to-one interconnect delay description or a multi-to-one interconnect delay description, i.e., the interconnect is connected to a driving cell and a driven cell or connected to a plurality of driving cells and a driven cell, the method proceeds to step S440, in which the delay data of the interconnect delay description is integrated into the cell delay description of the driving cell.

If the delay description is determined to be neither a one-to-one interconnect delay description nor a multi-to-one interconnect delay description, the method proceeds to step S450, in which whether the delay description is a one-to-multi interconnect delay description is determined. If it is determined that the delay description is a one-to-multi interconnect, i.e., the interconnect is connected to a driving cell and a plurality of driven cells, the method proceeds to step S460 in which the delay data of the interconnect delay description is integrated into the cell delay description of the driven cell. Thereafter, in step S470, a timing check value of the driven cell is adjusted based on the delay data of the delay description. The interconnect delay time should be added to the setup time and the recovery time to prevent the timing check result from being affected. The interconnect delay time should be subtracted from the holding time and the removal time to prevent the timing check result from being affected.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method suitable for converting a standard delay format file to generate a protected standard delay format file, said method comprising:
   reading a delay description of said standard delay format file;
   determining whether said delay description is an interconnect delay description; and
   if said delay description is an interconnect delay description, integrating delay data of said delay description into a cell delay description of a cell connected to an interconnect corresponding to said delay description based on type of said interconnect.

2. The method of claim 1, when said interconnect is an one-to-one interconnect, integrating the delay data of said delay description into a cell delay description of a driving cell or a driven cell connected to said interconnect.

3. The method of claim 1, when said interconnect is a multi-to-one interconnect, integrating the delay data of said delay description into a cell delay description for a driving cell connected to said interconnect.

4. The method of claim 1, when said interconnect is an one-to-multi interconnect, integrating the delay data of said delay description into a cell delay description for a driven cell connected to interconnect.

5. The method of claim 4, further comprising a step of adjusting a timing check value of said driven cell based on the delay data of said delay description after said step of integrating the delay data of said delay description into said cell delay description for said driven cell connected to said interconnect.

6. The method of claim 1, wherein said standard delay format file is an IEEE 1497 standard delay format file.

* * * * *